United States Patent [19]

Nakano et al.

[11] Patent Number: 5,640,238
[45] Date of Patent: Jun. 17, 1997

[54] METHOD OF INSPECTING PARTICLES ON WAFERS

[75] Inventors: Masami Nakano, Vancouver, Wash.; Isao Uchiyama, Fukushima-ken, Japan; Hiroyuki Takamatsu, Shirakawa, Japan; Morie Suzuki, Fukushima-ken, Japan

[73] Assignee: Shin-Etsu Handotai Co., Ltd., Tokyo, Japan

[21] Appl. No.: 694,318

[22] Filed: Aug. 8, 1996

[30] Foreign Application Priority Data

Aug. 9, 1995 [JP] Japan .................................. 7-203189

[51] Int. Cl.$^6$ ..................................................... G01N 21/00
[52] U.S. Cl. ............................................. 356/237; 356/338
[58] Field of Search ............................... 356/390, 237, 356/337–343; 437/8

[56] References Cited

U.S. PATENT DOCUMENTS 5,293,538  3/1994  Iwata et al. ........................... 356/237
5,355,212  10/1994  Wells et al. ........................... 356/237

Primary Examiner—Frank G. Font
Assistant Examiner—Amanda Merlino
Attorney, Agent, or Firm—Nikaido, Marmelstein, Murray & Oram LLP

[57] ABSTRACT

A method of inspecting particles on wafers is disclosed, wherein a first particle map is made by particle measurement on a wafer to be inspected, then a particle removing treatment is conducted to remove particles from the wafer, subsequently after a second particle map is made by particle measurement on the wafer which is subjected to the particle removing treatment, the first particle map is compared with the second particle map, and particles appearing at the immobile point common in both the first particle map and the second particle map are determined as crystal defects or surface irregularities such as scratches and particles appearing in the first particle map but those disappearing in the second particle map are determined as real dust particles or contaminants, thereby accurately detecting particles on wafers.

8 Claims, 5 Drawing Sheets

F I G . 2
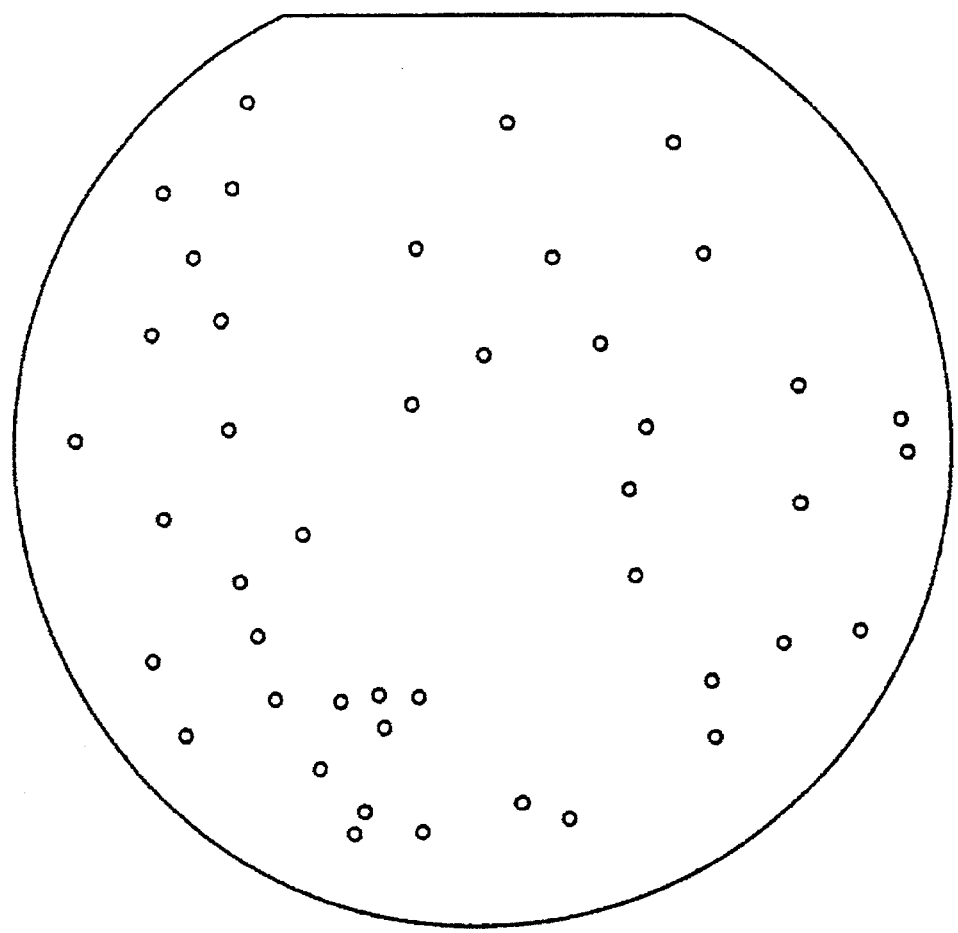

• PARTICLES DISAPPEARED AFTER CLEANING

○ PARTICLES NOT CHANGING THEIR POSITIONS BEFORE AND AFTER CLEANING

• PARTICLES NEWLY ADHERED AFTER CLEANING

○ PARTICLES NOT CHANGING THEIR POSITIONS BEFORE AND AFTER CLEANING

METHOD OF INSPECTING PARTICLES ON WAFERS

BACKGROUND OF THE INVENTION

1. Field of the Invention

The present invention relates to a method of inspecting particles on wafers which can accurately inspect particles as real dust particles of foreign matters on wafers such as semiconductor wafers.

2. Description of the Related Art

Particles on wafers are originated from some foreign matters like dust particles or contaminants adhered thereon are to be severely controlled because the particles affect adversely a manufacturing process of semiconductor devices. A conventional control limit of particle size is about 0.3 μm in diameter. As semiconductor devices become minuter, the particle size control limit of 0.2 μm or 0.1 μm or less is required. Particles on wafers are inspected by usually using a light scattering laser particle counter.

On the other hand, there exist a lot of crystal defects in silicon single crystals which are produced by usually using a CZ method. When wafers which are manufactured from silicon single crystals having a lot of crystal defects are treated by using a cleaning solution with etching effect such as a mixed solution of ammonia water, hydrogen peroxide water and water, the crystal defects are revealed predominantly as pits. If particles on the wafer are measured using a light scattering particle counter, the pits can not be discriminated from foreign matters like dust particles or contaminants because the pits act as light scattering points. Actually, with a light scattering particle counter, crystal defects of 0.2 μm or less are counted as particles on wafers. The counted number goes usually up to 500–1000 pieces a wafer. There are 20–30 pieces of particles a wafer which is manufactured by a special method.

Moreover, it is known that epitaxial wafers have a limited number of crystal defects. There exist actually several crystal defects an epitaxial wafer. When particles on epitaxial wafers are inspected using a light scattering particle counter, the crystal defects are inspected as particles of about 0.1 μm–0.2 μm. In addition, there exist surface irregularities such as scratches generated by various causes. When particles on such wafers are inspected using a light scattering particle counter, the surface irregularities are inspected as particles of 0.2 μm or less.

Thus, since crystal defects and surface irregularities such as scratches and particles of real dust particles or contaminants are confused in a particle inspection method using a light scattering laser particle counter, inspection of particles which are especially minute, for instance, 0.2 μm or less could do nothing but become inaccurate.

Then, under the present circumstances, there is a great demand for a method of inspecting particles oil wafers which can accurately distinguish particles of 0.2 μm or less from crystal defects or surface irregularities such as scratches.

SUMMARY OF THE INVENTION

With the foregoing problems in view, it is an object of this invention to provide a method of inspecting particles oil wafers which is capable of easily distinguishing particles on wafers such as semiconductor wafers from crystal defects or surface irregularities such as scratches and accurately detecting particles on wafers.

To attain the foregoing object, the present invention provides a method of inspecting particles on wafers which comprises the steps of: making a first particle map by particle measurement on a wafer to be inspected; performing a particle removing treatment to remove particles from the wafer; making a second particle map by particle measurement on the wafer which is subjected to the particle removing treatment; and comparing the first particle map with the second particle map, wherein particles appearing at the immobile point common in both the first particle map and the second particle map are determined as crystal defects or surface irregularities such as scratches and particles appearing in the first particle map but those disappearing in the second particle map are determined as real dust particles or contaminants. A particle map means a map showing points where particles exist on a wafer.

The particle removing treatment to remove particles from the wafer is preferably performed by using chemical cleaning with a mixed solution of ammonia water, hydrogen peroxide water and water and/or brush scrubbing cleaning (cleaning by scrubbing with a brush) in water. A light scattering particle counter is used for particle measurement on the wafer.

The above and other objects, features and advantages of the present invention will become manifest to those versed in the art upon making reference to the detailed description and the accompanying sheets of drawings.

BRIEF DESCRIPTION OF THE DRAWINGS

FIG. 2 is a view showing a first particle map in Example 1;

DETAILED DESCRIPTION

The present invention will be described in greater detail by way of the following examples which should be construed as illustrative rather than restrictive.

Figure 1:
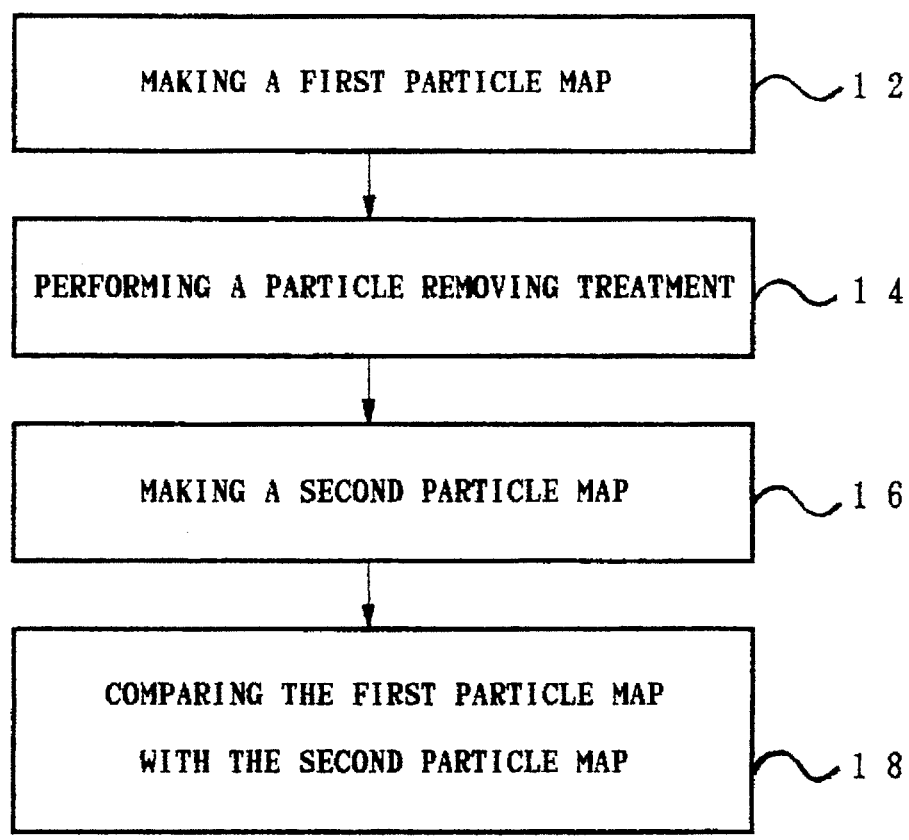
FIG. 1 is flow chart showing an embodiment of the present invention.

FIG. 1 is a flow chart showing an embodiment of the present invention. The present invention comprises a step 12 for making a first particle map, a step 14 for performing a particle removing treatment, a step 16 for making a second particle map and a step 18 for comparing the first particle map with the second particle map.

In the step 12 for making a first particle map, particles on a wafer to be inspected are measured by using a particle measurement means so as to make a first particle map, that is, a particle map on a wafer which is before being subjected to the particle removing treatment.

The wafers to be inspected on particles may be semiconductor wafers and the like. There is no special limitation on the wafers which are usually subjected to various pretreatments including cleaning. A light scattering particle counter may be used as a particle measurement means.

The step 14 for performing a particle removing treatment may be any desired one, so long as it can remove particles from a wafer. The particle removing treatment is preferably performed by using chemical cleaning with a mixture of ammonia water, hydrogen peroxide water and water and/or brush scrubbing cleaning (cleaning by scrubbing with a brush) in water.

As stated above, the purpose of the present invention is to provide a method of accurately inspecting particles on wafers. The present invention has another advantage that the performance of the particle removing technology or the cleaning technology can be evaluated by accurately measuring the number of particles on the wafer before and after the particle removing treatment such as the above cleaning. Moreover, according to this invention, a particle level in the wafer manufacturing process can be accurately monitored.

In the step 16 for making a second particle map, particles on a wafer to be inspected are detected by using a particle measurement means so as to make a second particle map, that is, a particle map on a wafer which is after being subjected to the particle removing treatment.

In the step 18 for comparing the first particle map with the second particle map, the total number of particles of the first and the second particle maps are counted respectively. For instance, the total number of particles in the first and the second particle maps are assumed to be A and B, respectively. Next, by overlapping the first particle map with the second particle map, immobile particles which do not change their positions on the wafer at all in both of the two maps are detected and the counted particle number thereof is assumed to be C. These detected immobile particles are crystal defects or surface irregularities such as scratches and not real dust particles or contaminants.

In the above mentioned case, the number of crystal defects or surface irregularities on the wafer is C. The number of particles as real dust particles or contaminants on the wafer before the particle removing treatment such as the cleaning is A–C. The number of particles as real dust particles or contaminants on the wafer after the particle removing treatment such as the cleaning is B–C. The existence of the real dust particles or contaminants after the particle removing treatment is due to the real dust particles or contaminants newly adhered on the wafer after the particle removing treatment such as the cleaning. Thus, there can be accurately inspected particles as real dust particles or contaminants.

EXAMPLE 1

Condition

Sample wafers: Czochralski-grown p-type, <100>-oriented, 200 mm-diameter, number of crystal defects; 20–30 pieces Cleaning: cleaning with a mixture of ammonia water, hydrogen peroxide water and water [ammonia water:hydrogen peroxide water:water= 1:1:10 (volume ratio), 80° C., 3 minutes, ammonia water: 28–30%, hydrogen peroxide water: 30%]

Particles on the sample wafer which was subjected to pretreatments including cleaning were inspected in terms of number and position thereof by using a laser particle counter LS-6000 (manufactured by HITACHI ELECTRONICS ENGINEERING CO.). FIG. 2 shows a first particle map made by this first inspection. The counted number of particles ($\leq 0.10$ μm) were 44 pieces a wafer.

Figure 3:
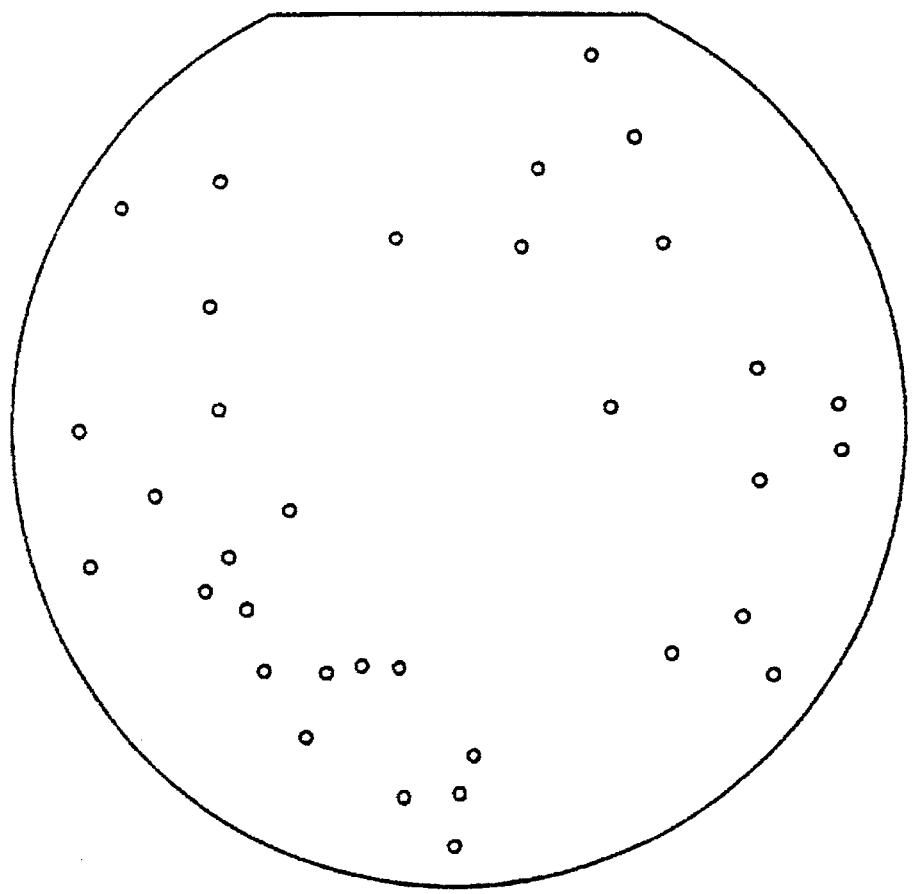
FIG. 3 is a view showing a second particle map in Example 1.

Then the sample wafer was subjected to the above mentioned cleaning with a mixture of ammonia water, hydrogen peroxide water and water and particles on the sample wafer were inspected again by the same way as above. FIG. 3 shows a second particle map made by this second inspection. The counted number of particles ($\leq 0.10$ μm) were 34 pieces a wafer.

Figure 4:
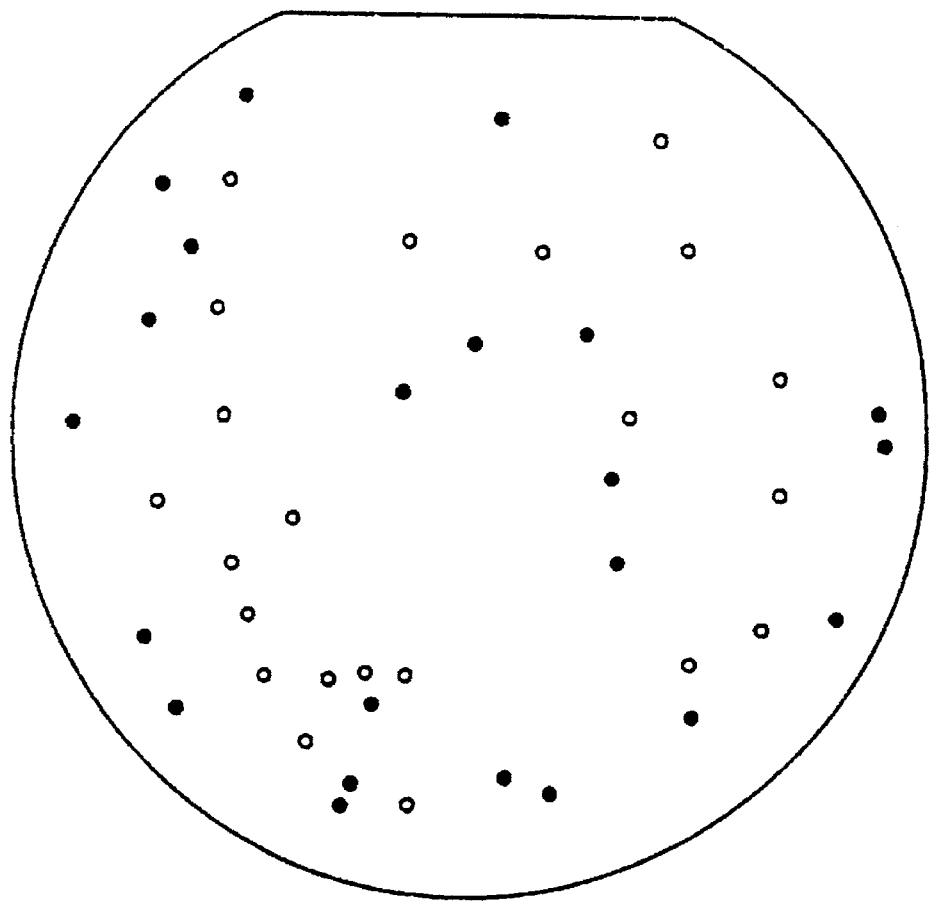
FIG. 4 is a view showing a first particle map in which mobile particles are distinguishable form immobile particles.
Figure 5:
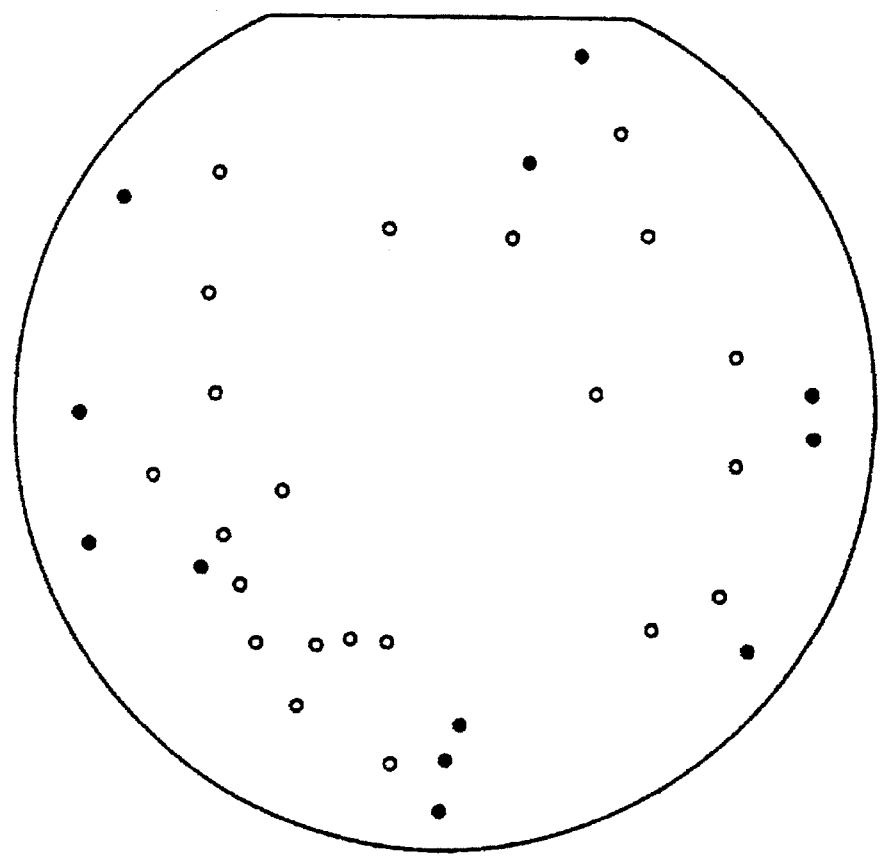
FIG. 5 is a view showing a second particle map in which mobile particles are distinguishable from immobile particles.

Next, when the first and the second particle maps were overlapped, as shown using white circles in FIGS. 4 and 5, it turned out that 22 pieces of the counted particles do not change their positions on the wafer at all in both of the two maps. In FIGS. 4 and 5, immobile particles are indicated by white circles and mobile particles by black dots, respectively.

In FIG. 4, the number of the immobile particles (white circles) which do not change their positions on the wafer at all before and after the above cleaning is 22 pieces and the number of mobile particles (black dots) which disappeared from the wafer after the above cleaning is 22 pieces. In FIG. 5, the number of the immobile particles (white circles) is 22 pieces as many as in FIG. 4, and the number of mobile particles (black dots) which were newly adhered on the wafer after the cleaning is 12 pieces. Since these immobile particles (white circles) were confirmed as crystal defects, it was able to determine that the number of the mobile particles (22 pieces of black dots in the total number of 44 pieces shown in FIG. 4) which was obtained by deducting the immobile particle number from the total particle number is a number of real dust particles or contaminants which existed on the wafer before the cleaning.

In the above Example 1, the treatment for removing particles from the wafer was conducted using only the cleaning with a mixture of ammonia water, hydrogen peroxide water and water. It is ascertained that similar results are obtained by only brush scrubbing cleaning in water or combining chemical cleaning with a mixture of ammonia water hydrogen peroxide water and water, and brush scrubbing cleaning in water.

As stated above, according to the method of the present invention, it is possible to easily distinguish particles on wafers from crystal defects or surface irregularities such as scratches and accurately detect particles on wafers. The present invention has another advantage that as the performance of the particle removing technology or the cleaning technology can be evaluated by accurately measuring the number of real dust particles or contaminants on the wafer due to contamination during the cleaning and so on, developments of the above technologies and the like are progressed. Moreover, according to this invention, a particle level in the wafer manufacturing process can be accurately monitored.

Obviously, various minor changes and modifications of the present invention are possible in the light of the above teaching. It is therefore to be understood that within the scope of the appended claims the invention may be practiced otherwise than as specifically described.

What is claimed is:

1. A method of inspecting particles on wafers which comprises the steps of:

(a) making a first particle map by particle measurement on a wafer to be inspected;

(b) performing a particle removing treatment to remove particles from the wafer;

(c) making a second particle map by particle measurement on the wafer which is subjected to the particle removing treatment; and (d) comparing the first particle map with the second particle map, wherein particles appearing at the immobile point common in both the first particle map and the second particle map are determined as crystal defects or surface irregularities such as scratches and particles appearing in the first particle map but those disappearing in the second particle map are determined as real dust particles or contaminants.

2. A method of inspecting particles on wafers according to claim 1, wherein the particle removing treatment is cleaning with a mixture of ammonia water, hydrogen peroxide water and water.

3. A method of inspecting particles on wafers according to claim 1, wherein the particle removing treatment is brush scrubbing cleaning.

4. A method of inspecting particles on wafers according to claim 1, wherein the particle removing treatment is a combination of cleaning with a mixture of ammonia water, hydrogen peroxide water and water, and brush scrubbing cleaning.

5. A method of inspecting particles on wafers according to claim 1, wherein the particle measurement on the wafer is carried out by using a light scattering particle counter.

6. A method of inspecting particles on wafers according to claim 2, wherein the particle measurement on the wafer is carried out by using a light scattering particle counter.

7. A method of inspecting particles on wafers according to claim 3, wherein the particle measurement on the wafer is carried out by using a light scattering particle counter.

8. A method of inspecting particles on wafers according to claim 4, wherein the particle measurement on the wafer is carried out by using a light scattering particle counter.

* * * * *